(12) United States Patent
Yue et al.

(10) Patent No.: US 8,048,326 B2
(45) Date of Patent: Nov. 1, 2011

(54) METHOD AND APPARATUS FOR DETERMINING AN ETCH PROPERTY USING AN ENDPOINT SIGNAL

(75) Inventors: Hongyu Yue, Austin, TX (US); Hieu A. Lam, Richardson, TX (US)

(73) Assignee: Tokyo Electron Limited, Tokyo (JP)

( * ) Notice: Subject to any disclaimer, the term of this patent is extended or adjusted under 35 U.S.C. 154(b) by 1696 days.

(21) Appl. No.: 10/531,469

(22) PCT Filed: Oct. 31, 2003

(86) PCT No.: PCT/US03/31528
§ 371 (c)(1),
(2), (4) Date: Apr. 15, 2005

(87) PCT Pub. No.: WO2004/042788
PCT Pub. Date: May 21, 2004

(65) Prior Publication Data
US 2006/0048891 A1     Mar. 9, 2006

Related U.S. Application Data

(60) Provisional application No. 60/422,511, filed on Oct. 31, 2002.

(51) Int. Cl.
*C23F 1/00* (2006.01)
*G01L 21/30* (2006.01)
(52) U.S. Cl. .......................... 216/60; 216/61
(58) Field of Classification Search .......... None
See application file for complete search history.

(56) References Cited

U.S. PATENT DOCUMENTS

| | | | | |
|---|---|---|---|---|
| 4,847,792 A * | 7/1989 | Barna et al. | ............. | 702/182 |
| 5,094,712 A * | 3/1992 | Becker et al. | ............. | 438/721 |
| 5,198,072 A * | 3/1993 | Gabriel | ............. | 216/59 |
| 5,200,023 A * | 4/1993 | Gifford et al. | ............. | 216/59 |
| 5,337,144 A * | 8/1994 | Strul et al. | ............. | 356/503 |
| 5,372,673 A * | 12/1994 | Stager et al. | ............. | 438/8 |
| 5,445,705 A * | 8/1995 | Barbee et al. | ............. | 216/86 |
| 5,450,205 A * | 9/1995 | Sawin et al. | ............. | 356/632 |
| 5,467,013 A | 11/1995 | Williams et al. | | |
| 5,489,361 A * | 2/1996 | Barbee et al. | ............. | 438/8 |
| 5,500,073 A * | 3/1996 | Barbee et al. | ............. | 156/345.16 |
| 5,501,766 A * | 3/1996 | Barbee et al. | ............. | 438/14 |
| 5,503,707 A * | 4/1996 | Maung et al. | ............. | 438/5 |

(Continued)

FOREIGN PATENT DOCUMENTS

JP     2002-170812     6/2002

(Continued)

*Primary Examiner* — Allan Olsen
(74) *Attorney, Agent, or Firm* — Oblon, Spivak, McClelland, Maier & Neustadt, L.L.P.

(57) ABSTRACT

The present invention presents a plasma processing system for etching a layer on a substrate comprising a process chamber, a diagnostic system coupled to the process chamber and configured to measure at least one endpoint signal, and a controller coupled to the diagnostic system and configured to determine in-situ at least one of an etch rate and an etch rate uniformity of the etching from the endpoint signal. Furthermore, an in-situ method of determining an etch property for etching a layer on a substrate in a plasma processing system is presented comprising the steps: providing a thickness of the layer; etching the layer on the substrate; measuring at least one endpoint signal using a diagnostic system coupled to the plasma processing system, wherein the endpoint signal comprises an endpoint transition; and determining the etch rate from a ratio of the thickness to a difference between a time during the endpoint transition and a starting time of the etching.

21 Claims, 9 Drawing Sheets

U.S. PATENT DOCUMENTS

| | | | |
|---|---|---|---|
| 5,573,624 A * | 11/1996 | Barbee et al. | 156/345.16 |
| 5,582,746 A * | 12/1996 | Barbee et al. | 216/86 |
| 5,658,418 A * | 8/1997 | Coronel et al. | 156/345.25 |
| 5,694,207 A * | 12/1997 | Hung et al. | 356/72 |
| 5,888,337 A | 3/1999 | Saito | |
| 5,928,532 A * | 7/1999 | Koshimizu et al. | 219/121.42 |
| 5,972,796 A * | 10/1999 | Yang et al. | 438/706 |
| 6,054,333 A * | 4/2000 | Bensaoula | 438/9 |
| 6,081,334 A * | 6/2000 | Grimbergen et al. | 356/499 |
| 6,104,487 A * | 8/2000 | Buck et al. | 356/316 |
| 6,129,807 A * | 10/2000 | Grimbergen et al. | 156/345.24 |
| 6,172,756 B1 * | 1/2001 | Chalmers et al. | 356/630 |
| 6,197,116 B1 * | 3/2001 | Kosugi | 118/712 |
| 6,204,922 B1 * | 3/2001 | Chalmers | 356/630 |
| 6,238,937 B1 * | 5/2001 | Toprac et al. | 438/9 |
| 6,379,980 B1 * | 4/2002 | Toprac | 438/8 |
| 6,390,019 B1 * | 5/2002 | Grimbergen et al. | 118/723 R |
| 6,406,924 B1 * | 6/2002 | Grimbergen et al. | 438/9 |
| 6,419,846 B1 * | 7/2002 | Toprac et al. | 216/60 |
| 6,450,683 B1 | 9/2002 | Lee | |
| 6,559,942 B2 * | 5/2003 | Sui et al. | 356/369 |
| 6,564,114 B1 * | 5/2003 | Toprac et al. | 700/121 |
| 6,582,618 B1 * | 6/2003 | Toprac et al. | 216/59 |
| 6,650,426 B1 * | 11/2003 | Zalicki | 356/626 |
| 6,669,810 B1 * | 12/2003 | Miyazaki et al. | 156/345.1 |
| 6,673,199 B1 * | 1/2004 | Yamartino et al. | 156/345.49 |
| 6,675,137 B1 * | 1/2004 | Toprac et al. | 703/2 |
| 6,677,246 B2 * | 1/2004 | Scanlan et al. | 438/723 |
| 6,712,927 B1 * | 3/2004 | Grimbergen et al. | 156/345.24 |
| 6,745,095 B1 * | 6/2004 | Ben-Dov et al. | 700/121 |
| 6,805,810 B2 * | 10/2004 | Smith et al. | 216/60 |
| 6,824,813 B1 * | 11/2004 | Lill et al. | 427/8 |
| 6,855,567 B1 * | 2/2005 | Ni et al. | 438/8 |
| 6,888,639 B2 * | 5/2005 | Goebel et al. | 356/504 |
| 6,908,846 B2 * | 6/2005 | McMillin et al. | 438/622 |
| 6,919,279 B1 * | 7/2005 | Rulkens et al. | 438/706 |
| 6,977,184 B1 * | 12/2005 | Chou et al. | 438/9 |
| RE39,145 E * | 6/2006 | Perry et al. | 356/630 |
| 7,297,287 B2 * | 11/2007 | Fatke et al. | 216/59 |
| 7,297,560 B2 * | 11/2007 | Yue | 438/9 |
| 7,462,335 B2 * | 12/2008 | Liu et al. | 422/186.05 |
| 2002/0048019 A1 * | 4/2002 | Sui et al. | 356/369 |
| 2002/0186381 A1 * | 12/2002 | Subrahmanyan et al. | 356/630 |
| 2003/0036282 A1 | 2/2003 | Usui et al. | |
| 2003/0043383 A1 * | 3/2003 | Usui et al. | 356/504 |
| 2003/0119215 A1 * | 6/2003 | Petrucci, Jr. | 438/14 |
| 2003/0136663 A1 * | 7/2003 | Smith et al. | 204/192.13 |
| 2004/0018127 A1 * | 1/2004 | Long et al. | 422/186.04 |
| 2004/0063328 A1 * | 4/2004 | Wen et al. | 438/706 |
| 2004/0080050 A1 * | 4/2004 | McMillin et al. | 257/758 |
| 2004/0117054 A1 * | 6/2004 | Gotkis et al. | 700/121 |
| 2004/0206621 A1 * | 10/2004 | Li et al. | 204/229.8 |
| 2005/0016947 A1 * | 1/2005 | Fatke et al. | 216/2 |
| 2005/0062982 A1 * | 3/2005 | Usui et al. | 356/504 |
| 2005/0082482 A1 * | 4/2005 | Ludviksson | 250/342 |
| 2006/0035395 A1 * | 2/2006 | Venugopal | 438/14 |
| 2006/0132798 A1 * | 6/2006 | Usui et al. | 356/504 |
| 2006/0189006 A1 * | 8/2006 | Yamashita et al. | 438/9 |
| 2010/0055807 A1 * | 3/2010 | Srivastava et al. | 438/9 |

FOREIGN PATENT DOCUMENTS

| | | |
|---|---|---|
| JP | 2002-280368 | 9/2002 |

* cited by examiner

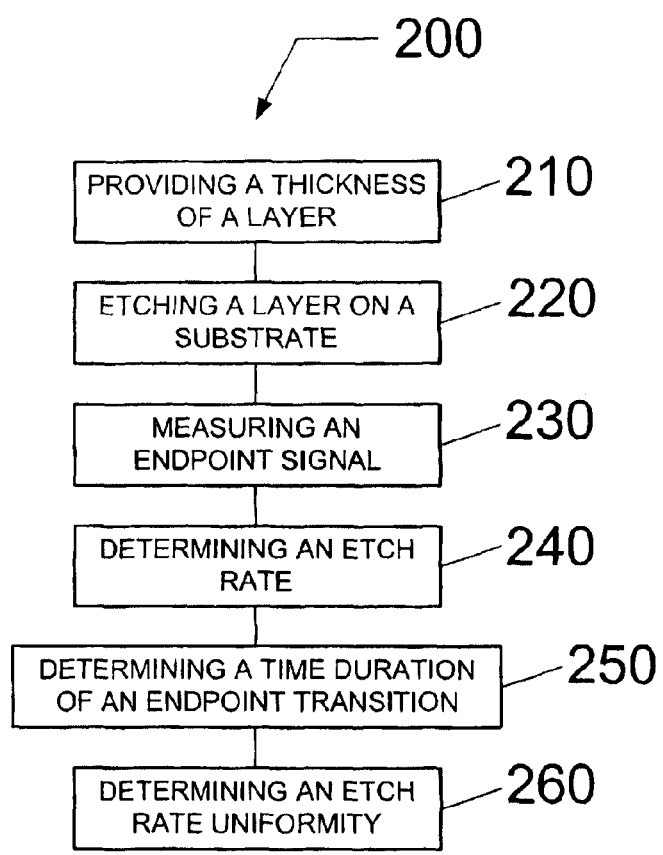

METHOD AND APPARATUS FOR DETERMINING AN ETCH PROPERTY USING AN ENDPOINT SIGNAL

CROSS-REFERENCE TO RELATED APPLICATIONS

This application claims priority to U.S. Provisional Application Ser. No. 60/422,511, filed Oct. 31, 2002, and is related to application 60/422,510, entitled "Method and apparatus for detecting endpoint,", filed on Oct. 31, 2002. The contents of these applications are incorporated herein by reference.

BACKGROUND OF THE INVENTION

1. Field of the Invention

The present invention relates to a method and apparatus for plasma processing a substrate, and more particularly to an in-situ method and apparatus for determining an etch property of a layer on a substrate during a plasma etch process.

2. Discussion of the Background

The fabrication of integrated circuits (IC) in the semiconductor device manufacturing industry typically employs plasma to create and assist surface chemistry necessary to remove material from and to deposit material to a substrate. In general, plasma is formed within a plasma processing system under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the processing system (e.g., etching processes during which materials are removed from the substrate or deposition processes during which materials are added to the substrate). During, for example, an etch process, monitoring the etch rate and the spatial uniformity of the etch rate can be very important when determining the state of a plasma processing system and for qualifying such a system following a maintenance interval. In current manufacturing practice, system qualification is usually performed by executing a series of qualification substrates and measuring the resultant etch rate and etch rate uniformity to determine whether to continue production or to perform system maintenance such as a wet clean of the process chamber. Furthermore, the method of determining the etch rate and the uniformity of the etch rate involves substrate cleaving (i.e. sacrifice of the substrate), and SEM (scanning electron microscope) analysis. Using SEM micrographs, feature etch depths can be measured at different locations on the qualification substrates and, when combined with the etch time, information for etch rate and etch rate uniformity can be acquired.

Consequently, significant system production time is expended and qualification substrates are consumed, hence, leading to greater production costs during the tedious qualification process. Moreover, production substrates and qualification substrates can differ substantially and, therefore, lead to erroneous conclusions regarding system qualification. For example, the measured etch rate on qualification substrates does not necessarily reflect the real etch rate on the production wafer.

SUMMARY OF THE INVENTION

The present invention provides a method and system for determining an etch property during an etch process, wherein the method advantageously addresses the above-identified shortcomings.

It is an object of the present invention to provide a plasma processing system for etching a layer on a substrate comprising: a process chamber; a diagnostic system coupled to the process chamber and configured to measure at least one endpoint signal; and a controller coupled to the diagnostic system and configured to determine in-situ at least one of an etch rate and an etch rate uniformity of the etching from the endpoint signal and a thickness of the layer, wherein the thickness comprises at least one of a minimum thickness, a maximum thickness, a mean thickness, and a thickness range.

It is another object of the present invention to provide an in-situ method of determining an etch property for etching a layer on a substrate in a plasma processing system comprising: providing a thickness of the layer, wherein the thickness comprises at least one of a minimum thickness, a maximum thickness, a mean thickness, and a thickness range; etching the layer on the substrate; measuring at least one endpoint signal using a diagnostic system coupled to the plasma processing system, wherein the endpoint signal comprises an endpoint transition; and determining the etch rate from a ratio of the thickness to a difference between a time during the endpoint transition and a starting time of the etching.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where:

FIG. 9 presents an in-situ method of determining an etch property for etching a layer on a substrate in a plasma processing system according to an embodiment of the present invention.

DETAILED DESCRIPTION OF AN EMBODIMENT

Figure 1:
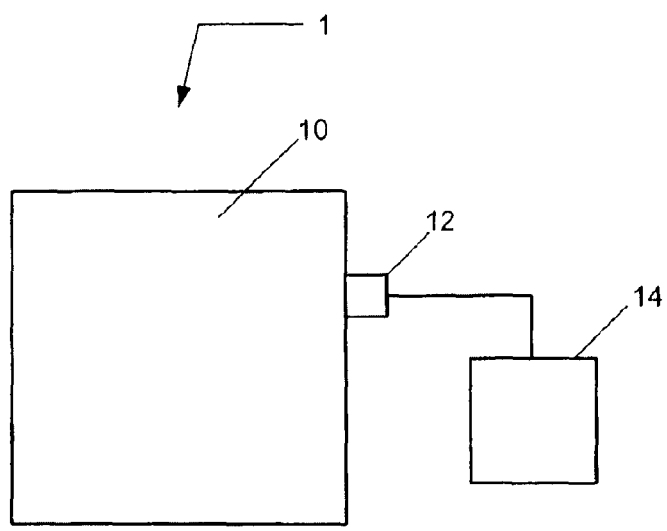
FIG. 1 shows a simplified block diagram of a plasma processing system according to an embodiment of the present invention.

According to an embodiment of the present invention, a plasma processing system 1 is depicted in FIG. 1 comprising a plasma processing chamber 10, a diagnostic system 12 coupled to the process chamber 10, and a controller 14 coupled to the diagnostic system 12. The controller 14 is configured to receive at least one endpoint signal from the diagnostic system 12 and to determine an etch property, such as an etch rate or an etch rate uniformity, from the at least one endpoint signal. In the embodiment illustrated in FIG. 1, plasma processing system 1 utilizes a plasma for material processing. Desirably, plasma processing system 1 comprises an etch chamber.

Figure 2:
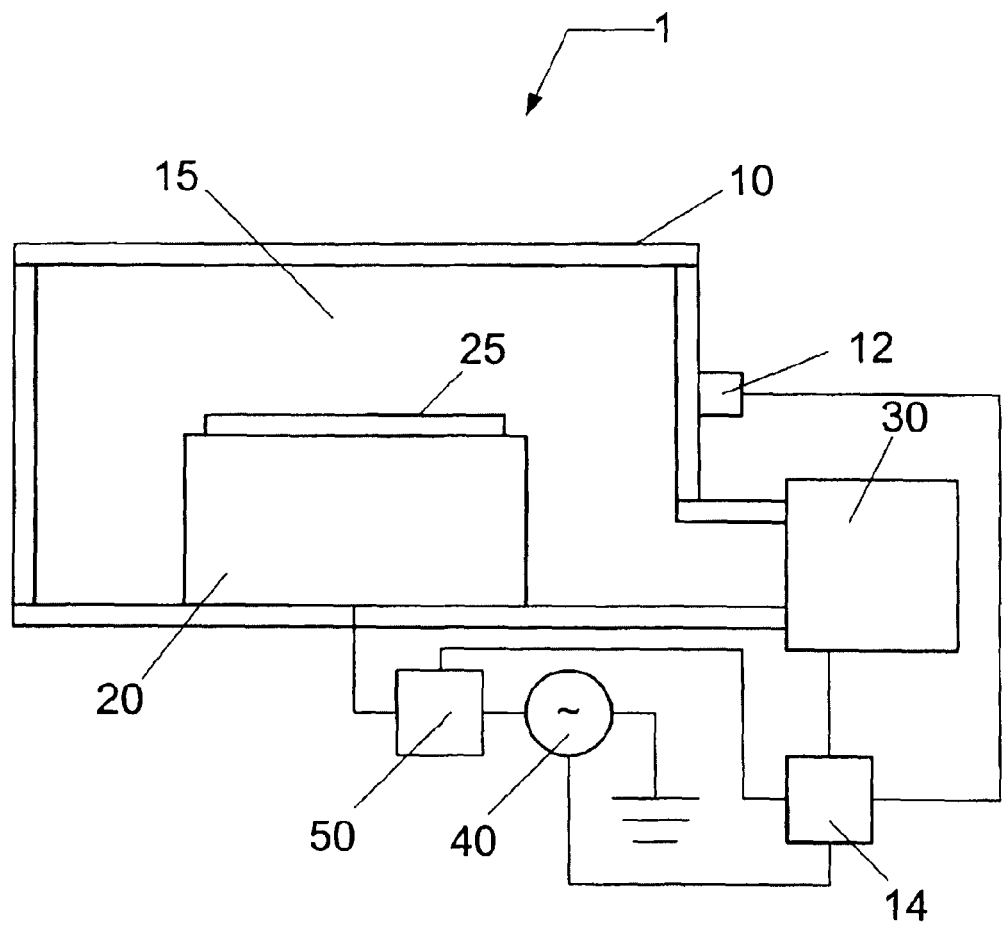
FIG. 2 shows a schematic diagram of a plasma processing system according to another embodiment of the present invention.

According to the illustrated embodiment of the present invention depicted in FIG. 2, plasma processing system 1 can comprise plasma processing chamber 10, substrate holder 20, upon which a substrate 25 (e.g., a semiconductor wafer or a liquid crystal display panel) to be processed is affixed, and vacuum pumping system 30. Substrate 25 can be, for example, a semiconductor substrate, a wafer or a liquid crystal display. Plasma processing chamber 10 can be, for example, configured to facilitate the generation of plasma in processing region 15 adjacent a surface of substrate 25. An ionizable gas or mixture of gases is introduced via gas injection system (not shown) and the process pressure is adjusted. For example, a control mechanism (not shown) can be used to throttle the vacuum pumping system 30. Desirably, plasma is utilized to create materials specific to a pre-determined materials process, and to aid the removal of material from the exposed surfaces of substrate 25. The plasma processing system 1 can be configured to process 200 mm substrates, 300 mm substrates, or larger.

Substrate 25 can be, for example, transferred into and out of plasma processing chamber 10 through a slot valve (not shown) and chamber feed-through (not shown) via robotic substrate transfer system where it is received by substrate lift pins (not shown) housed within substrate holder 20 and mechanically translated by devices housed therein. Once substrate 25 is received from substrate transfer system, it is lowered to an upper surface of substrate holder 20.

Substrate 25 can be, for example, affixed to the substrate holder 20 via an electrostatic clamping system. Furthermore, substrate holder 20 can, for example, further include a cooling system including a re-circulating coolant flow that receives heat from substrate holder 20 and transfers heat to a heat exchanger system (not shown), or when heating, transfers heat from the heat exchanger system. Moreover, gas can, for example, be delivered to the back-side of substrate 25 via a backside gas system to improve the gas-gap thermal conductance between substrate 25 and substrate holder 20. Such a system can be utilized when temperature control of the substrate is required at elevated or reduced temperatures. In other embodiments, heating elements, such as resistive heating elements, or thermoelectric heaters/coolers can be included.

Plasma processing chamber 10 can, for example, further comprise a vertical translational device (not shown) surrounded by a bellows (not shown) coupled to the substrate holder 20 and the plasma processing chamber 10, and configured to seal the vertical translational device from the reduced pressure atmosphere in plasma processing chamber 10. Additionally, a bellows shield (not shown) can, for example, be coupled to the substrate holder 20 and configured to protect the bellows from the processing plasma. Substrate holder 20 can, for example, further provide a focus ring (not shown), a shield ring (not shown), and a baffle plate (not shown).

In the illustrated embodiment, shown in FIG. 2, substrate holder 20 can comprise an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, RF power is applied to the substrate holder electrode at multiple frequencies. Furthermore, impedance match network 50 serves to increase the transfer of RF power to plasma in plasma processing chamber 10 by minimizing the reflected power. Match network topologies (e.g. L-type, π-type, T-type, etc.) and automatic control methods are well known to those skilled in the art.

With continuing reference to FIG. 2, process gas can be, for example, introduced to processing region 15 through gas injection system (not shown). Process gas can, for example, include a mixture of gases such as argon, CF4 and O2, or argon, C4F8 and O2 for oxide etch applications, or other chemistries such as O2/CO/Ar/C4F8, O2/CO/Ar/C5F8, O2/CO/Ar/C4F6, O2/Ar/C4F6, O2/Ar/C5F8, N2/H2, as well as other similar chemistries known in the art. The gas injection system can include a showerhead, where process gas is supplied from a gas delivery system (not shown) to the processing region 15 through a gas injection plenum (not shown), a series of baffle plates (not shown) and a multi-orifice showerhead gas injection plate (not shown). Gas injection systems are well known to those skilled in the art of vacuum processing.

Vacuum pump system 30 can, for example, include a turbomolecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 14 comprises a microprocessor, memory, and a digital I/O port capable of generating control signals sufficient to communicate and activate inputs to plasma processing system 1 as well as monitor outputs from plasma processing system 1. Moreover, controller 14 can be coupled to and can exchange information with RF generator 40, impedance match network 50, the gas injection system (not shown), vacuum pump system 30, as well as the backside gas delivery system (not shown), the substrate/substrate holder temperature measurement system (not shown), and the electrostatic clamping system (not shown). For example, a program stored in the memory can be utilized to activate the inputs to the aforementioned components of plasma processing system 1 according to a stored process recipe. One example of controller 14 is a DELL PRECISION WORKSTATION 610™, available from Dell Corporation, Austin, Tex.

The diagnostic system 12 can include an optical diagnostic subsystem. The optical diagnostic subsystem can comprise a detector such as a (silicon) photodiode or a photomultiplier tube (PMT) for measuring the total light intensity emitted from the plasma. The diagnostic system 12 can further include an optical filter such as a narrow-band interference filter. In an alternate embodiment, the diagnostic system 12 can include at least one of a line CCD (charge coupled device), a CID (charge injection device) array, and a light dispersing device such as a grating or a prism. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337. Furthermore, diagnostic system 12 can also comprise a processor coupled to the optical diagnostic subsystem and to the controller 14 for controlling the operation of the optical diagnostic system.

For example, diagnostic system 12 can include a high resolution OES sensor from Peak Sensor Systems, or Verity Instruments, Inc. Such an OES sensor has a broad spectrum that spans the ultraviolet (UV), visible (VIS) and near infrared (NIR) light spectrums. The resolution is approximately 1.4 Angstroms, that is, the sensor is capable of collecting 5550 wavelengths from 240 to 1000 nm. The sensor is equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

Alternately, diagnostic system 12 can comprise an electrical diagnostic subsystem that can include at least one of a current and/or voltage probe for monitoring an electrical property of the plasma processing system 1, a power meter, and a spectrum analyzer. For example, plasma processing systems often employ RF power to form plasma, in which case, a RF transmission line, such as, for instance, a coaxial cable or structure, is employed to couple RF energy to the plasma through an electrical coupling element (i.e. inductive coil, electrode, etc.). Electrical measurements using, for example, a current-voltage probe, can be exercised anywhere within the electrical (RF) circuit, such as within a RF transmission line. Furthermore, the measurement of an electrical signal, such as a time trace of voltage or current, permits the transformation of the signal into frequency space using discrete Fourier series representation (assuming a periodic signal). Thereafter, the Fourier spectrum (or for a time varying signal, the frequency spectrum) can be monitored and analyzed to characterize the state of plasma processing system 1. An endpoint signal can be ascertained from a voltage signal, a current signal, an impedance signal, or a harmonic signal thereof. A voltage-current probe can be, for example, a device as described in detail in pending U.S. application Ser. No. 60/259,862 filed on Jan. 8, 2001, or in U.S. Pat. No. 5,467,013 issued to Sematech, Inc. on Nov. 14, 1995; each of which is incorporated herein by reference in its entirety.

In alternate embodiments, diagnostic system 12 can comprise a broadband RF antenna useful for measuring a radiated RF field external to plasma processing system 1. An endpoint signal can be ascertained from a radiated signal, or a harmonic signal thereof. A commercially available broadband RF antenna is a broadband antenna such as Antenna Research Model RAM-220 (0.1 MHz to 300 MHz). The use of a broadband RF antenna is described in greater detail in pending U.S. application No. 60/393,101 filed on Jul. 3, 2002, pending U.S. application No. 60/393,103 filed on Jul. 3, 2002, and pending U.S. application No. 60/393,105 filed on Jul. 3, 2002; each of which is incorporated herein by reference in their entirety.

In alternate embodiments, an endpoint signal can be ascertained from a diagnostic system 12 coupled to an impedance match network to monitor capacitor settings in the impedance match network. The impedance match network can be, for example, impedance match network 50 in FIGS. 2 through 5, impedance match network 74 in FIG. 4, and impedance match network 84 in FIG. 5.

Figure 3:
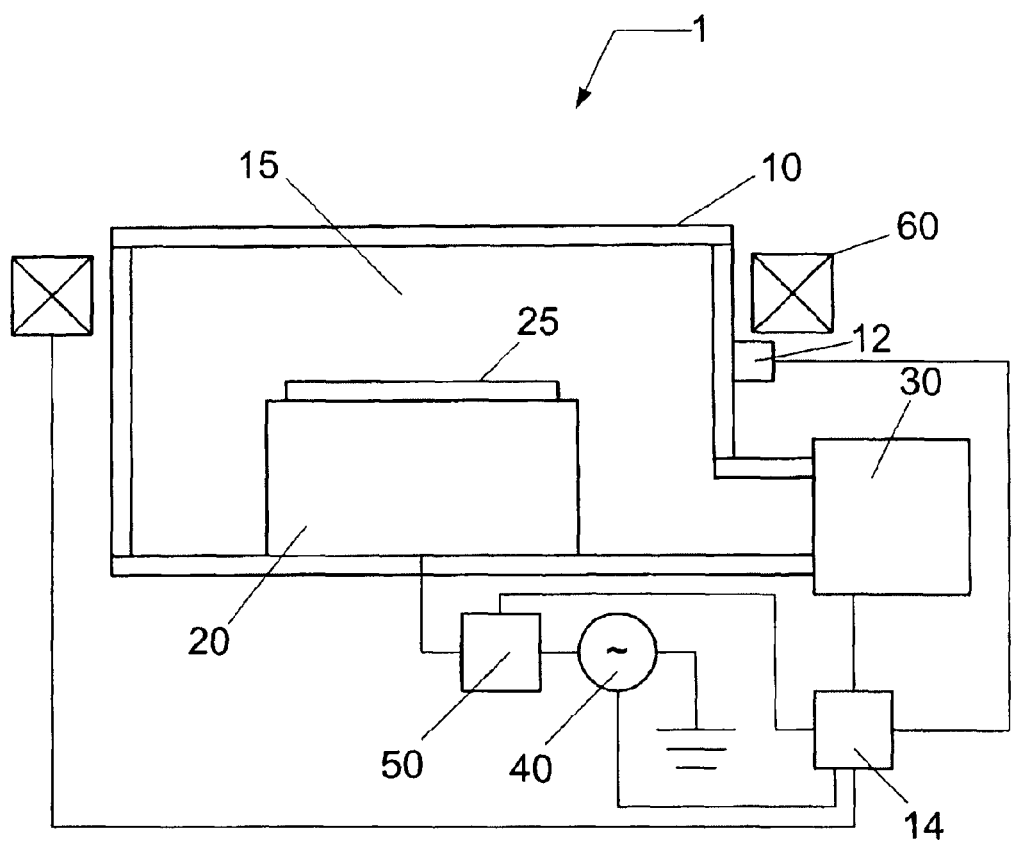
FIG. 3 shows a schematic diagram of a plasma processing system according to another embodiment of the present invention.

In the illustrated embodiment, shown in FIG. 3, the plasma processing system 1 can, for example, further comprise either a stationary, or mechanically or electrically rotating DC magnetic field system 60, in order to potentially increase plasma density and/or improve plasma processing uniformity, in addition to those components described with reference to FIGS. 1 and 2. Moreover, controller 14 is coupled to rotating magnetic field system 60 in order to regulate the speed of rotation and field strength. The design and implementation of a rotating magnetic field is well known to those skilled in the art.

Figure 4:
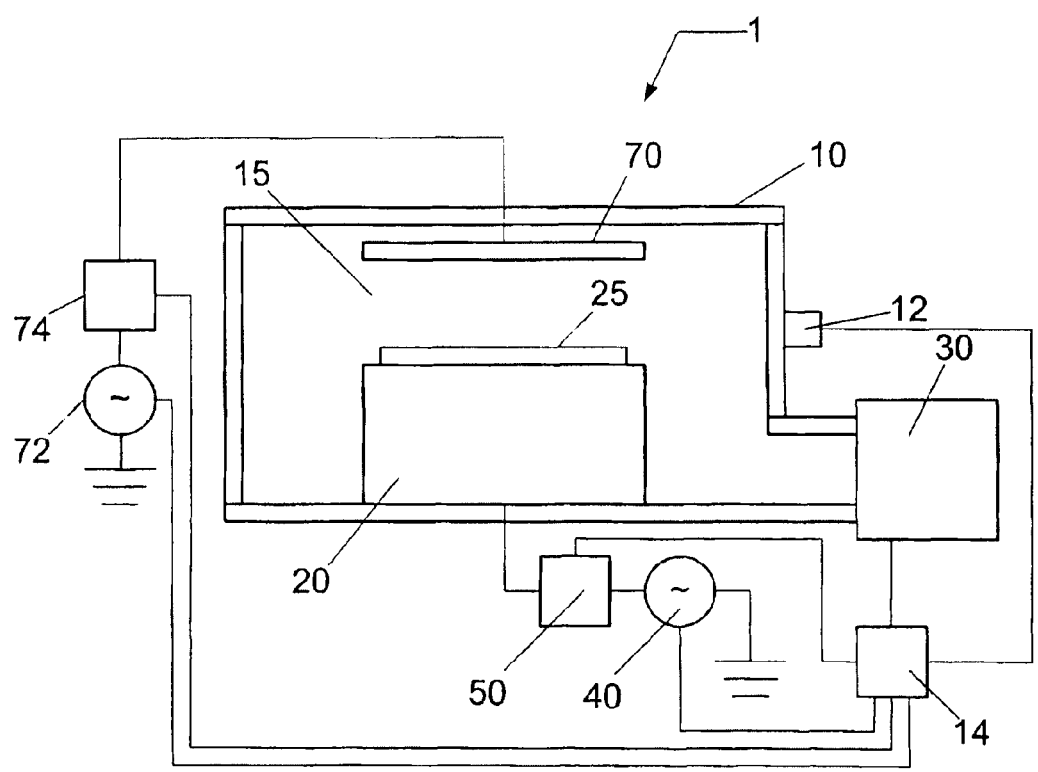
FIG. 4 shows a schematic diagram of a plasma processing system according to another embodiment of the present invention.

In the illustrated embodiment, shown in FIG. 4, the plasma processing system 1 of FIGS. 1 and 2 can, for example, further comprise an upper electrode 70 to which RF power can be coupled from RF generator 72 through impedance match network 74. A typical frequency for the application of RF power to the upper electrode can range from 10 MHz to 200 MHz and is preferably 60 MHz. Additionally, a typical frequency for the application of power to the lower electrode can range from 0.1 MHz to 30 MHz and is preferably 2 MHz. Moreover, controller 14 is coupled to RF generator 72 and impedance match network 74 in order to control the application of RF power to upper electrode 70. The design and implementation of an upper electrode is well known to those skilled in the art.

Figure 5:
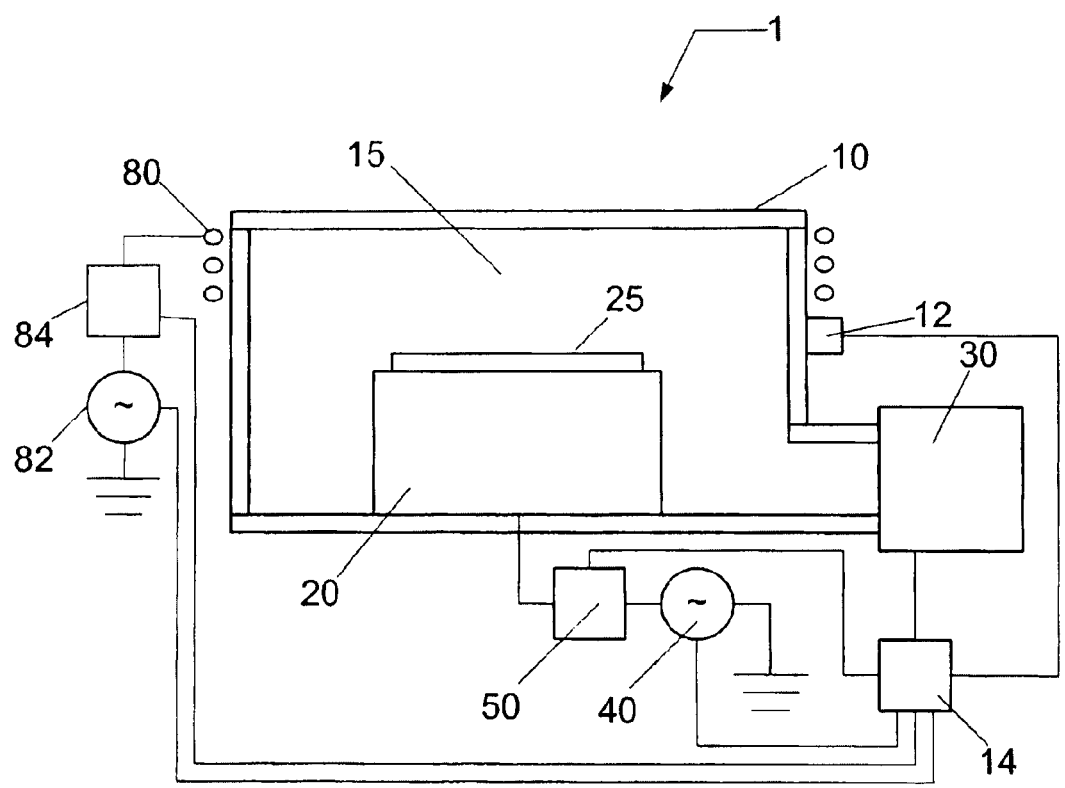
FIG. 5 shows a schematic diagram of a plasma processing system according to another embodiment of the present invention.

In the illustrated embodiment, shown in FIG. 5, the plasma processing system of FIG. 1 can, for example, further comprise an inductive coil 80 to which RF power is coupled via RF generator 82 through impedance match network 84. RF power is inductively coupled from inductive coil 80 through dielectric window (not shown) to plasma processing region 45. A typical frequency for the application of RF power to the inductive coil 80 can range from 10 MHz to 100 MHz and is preferably 13.56 MHz. Similarly, a typical frequency for the application of power to the chuck electrode can range from 0.1 MHz to 30 MHz and is preferably 13.56 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the following discussion, an in-situ method of determining an etch rate and an etch rate uniformity for etching a layer on a substrate in plasma processing system 1 is presented using optical emission spectroscopy (OES) as an example.

However, the methods discussed are not to be limited in scope by this exemplary presentation.

Figure 6:
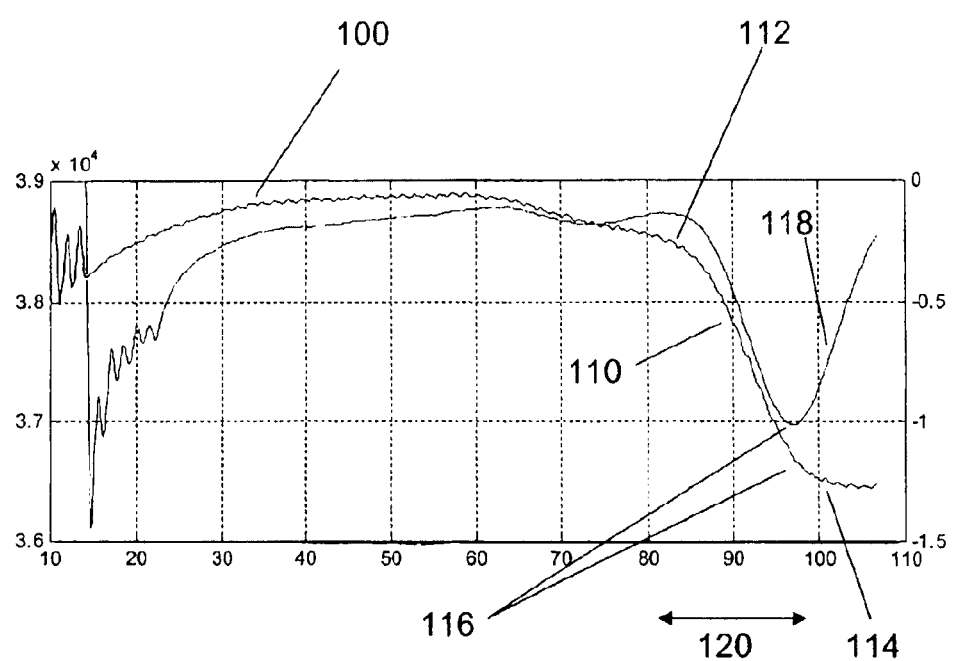
FIG. 6 illustrates an exemplary endpoint signal according to an embodiment of the present invention.

Referring again to FIGS. 1 through 5, diagnostic system 12 can comprise an optical diagnostic subsystem that is utilized to measure the irradiance, or spectral irradiance, of light emitted from the plasma. For example, FIG. 6 presents an exemplary endpoint signal 100 for light of a given wavelength emitted from plasma in the process space 15 and its first derivative 118. The endpoint signal 100 can further comprise an endpoint transition 110, wherein a distinct change in endpoint signal 100 constitutes an endpoint of the process. For example, light emission corresponding to a specific chemical constituent present during the etch reaction, that either decays (as in FIG. 6) or increases in concentration (and, hence, spectral irradiance) during endpoint, can be selected for monitoring purposes.

In an embodiment of the present invention, an etch rate for a layer of material comprising a thickness T can be determined from a ratio of the thickness T to the time duration between the start of the etch process (i.e. time $t_0=0$ in the signal endpoint 100) and a time t during the endpoint transition 110. In this case, $$E \cong \frac{T}{(t - t_0)}, \tag{1}$$

where E is the etch rate.

In another embodiment of the present invention, an etch rate for a layer of material comprising a minimum thickness $T_{min}$, a maximum thickness $T_{max}$, and a mean thickness $T_{mean}$ can be determined from the ratio of the minimum layer thickness to the time duration beginning with the start of the etch process (i.e. time $t_0=0$ in the endpoint signal 100) to the start time 112 of the endpoint transition 110 (see FIG. 6). In this case, $$E \cong \frac{T_{min}}{(t_{112} - t_0)}, \tag{2}$$

where E is the etch rate, $t_0$ is the starting time of the etch process, and $t_{112}$ is the starting time 112 of the endpoint transition 110.

In another embodiment of the present invention, an etch rate for a layer of material comprising a minimum thickness $T_{min}$, a maximum thickness $T_{max}$, and a mean thickness $T_{mean}$ can be determined from the ratio of the maximum layer thickness to the time duration beginning with the start of the etch process (i.e. time $t_0=0$ in the endpoint signal 100) to the end time 114 of the endpoint transition 110 (see FIG. 6). In this case, $$E \cong \frac{T_{max}}{(t_{114} - t_0)}, \tag{3}$$

where E is the etch rate, $t_0$ is the starting time of the etch process, and $t_{114}$ is the end time 114 of the endpoint signal 110.

In another embodiment of the present invention, an etch rate for a layer of material comprising a minimum thickness $T_{min}$, a maximum thickness $T_{max}$, and a mean thickness $T_{mean}$ can be determined from the ratio of the mean layer thickness to the time duration beginning with the start of the etch process (i.e. time $t_0=0$ in the endpoint signal 100) to the inflection time 116 of the endpoint transition 110 corresponding to the inflection point in endpoint transition 110 or the maximum (in negative slope) of the first derivative 118 of the endpoint signal 100 (see FIG. 6). In this case, $$E \cong \frac{T_{mean}}{(t_{116} - t_0)}, \tag{4}$$

where E is the etch rate, $t_0$ is the starting time of the etch process, and $t_{116}$ is the inflection time 116 of the endpoint transition 110 as described above.

In another embodiment of the present invention, an etch rate uniformity for a layer of material comprising a minimum thickness $T_{min}$, a maximum thickness $T_{max}$, a mean thickness $T_{mean}$, and a thickness range $\Delta T$ can be determined from the maximum etch rate $E_{max}$, the minimum etch rate $E_{min}$, the maximum thickness, the thickness range, and the time span $\Delta t$ (indicated as 120 in FIG. 6) of the endpoint transition 110. In this case, $$\Delta E \cong \frac{E_{max} E_{min}}{T_{max}} \left( \Delta t - \frac{\Delta T}{E_{max}} \right), \tag{5}$$

where $\Delta E$ is the etch rate uniformity. Since $E_{max} E_{min} \sim E^2$, equation (5) can be simplified as $$\Delta E \cong \frac{E}{T_{max}} (E \Delta t - \Delta T). \tag{6}$$

Figure 7A:
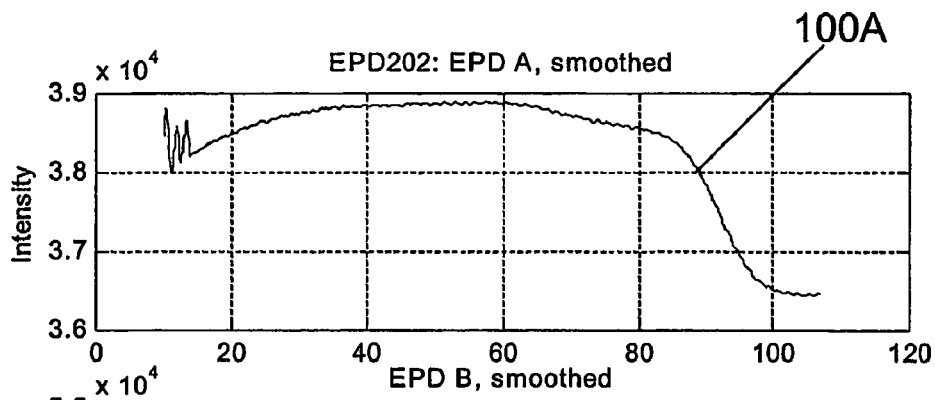
FIGS. 7A-7D illustrate a series of graphs showing various exemplary endpoint signals according to another embodiment of the present invention.
Figure 7B:
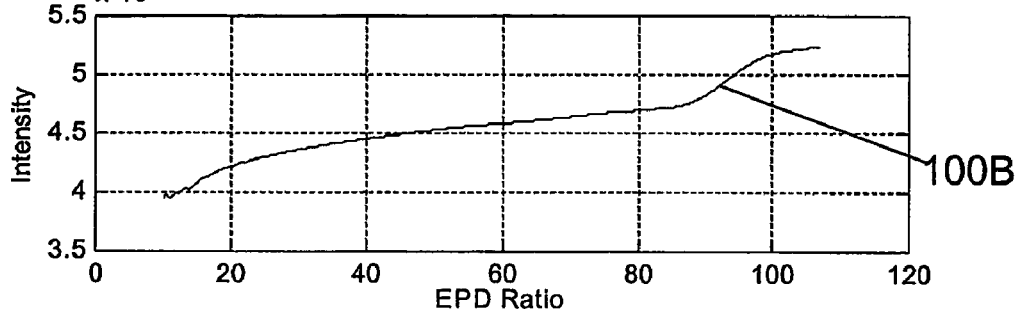
Figure 7C:
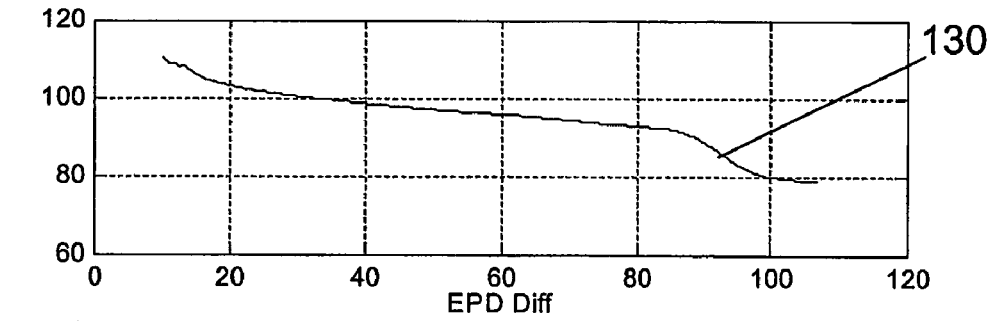
Figure 7D:
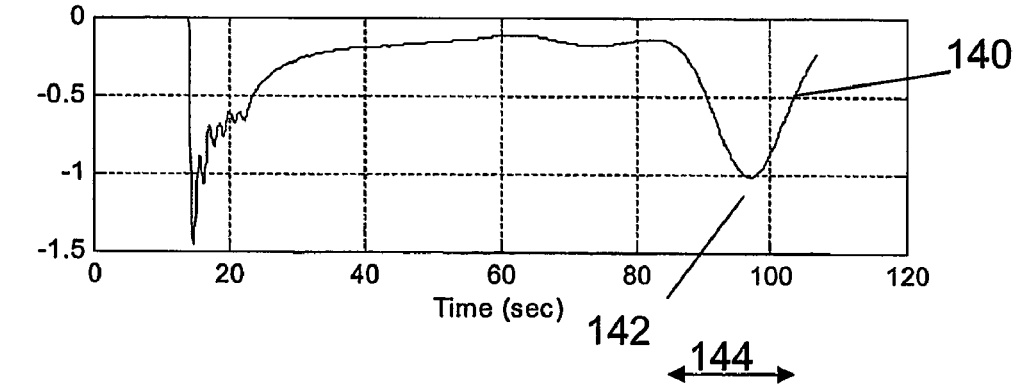

In another embodiment of the present invention, an etch rate for a layer of material comprising a minimum thickness $T_{min}$, a maximum thickness $T_{max}$, and a mean thickness $T_{mean}$ can be determined from two or more signals from diagnostic system 12, such as endpoint signals 100A and 100B shown in FIGS. 7A and 7B. Endpoint signal 100A can, for example, correspond to emission from a chemical constituent whose concentration decays during endpoint, and endpoint signal 100B can, for example, correspond to emission from a chemical constituent whose concentration rises during endpoint. One or more ratio signals can then be determined from the two or more signals, such as the ratio signal 130 (FIG. 7C) determined by dividing endpoint signal 100A by endpoint signal 100B at each instant in time. Furthermore, one or more differential signals can be determined from the one or more ratio signals, such as differential signal 140 (FIG. 7D) determined from a first derivative of the ratio signal 130. For example, the first derivative can be estimated using a first order (forward or backward) difference scheme, or a second order (central) difference scheme. As described above, an etch rate can be determined from the ratio of the mean layer thickness to the time duration beginning with the start of the etch process (i.e. time t=0 in the signals 100A, 100B) to the inflection time of the ratio signal 130 corresponding to the inflection point in ratio signal 130 (FIG. 7C) or the maximum 142 (in negative slope) of the differential signal 140 (see FIG. 7D). In this case, $$E \cong \frac{T_{mean}}{(t_{142} - t_0)}, \tag{7}$$

where E is the etch rate, $t_0$ is the starting time of the etch process, and $t_{142}$ is the time corresponding to the negative slope maximum 142 in differential signal 140. Moreover, an etch rate uniformity can be determined from equation (6) as described above.

Figure 8A:
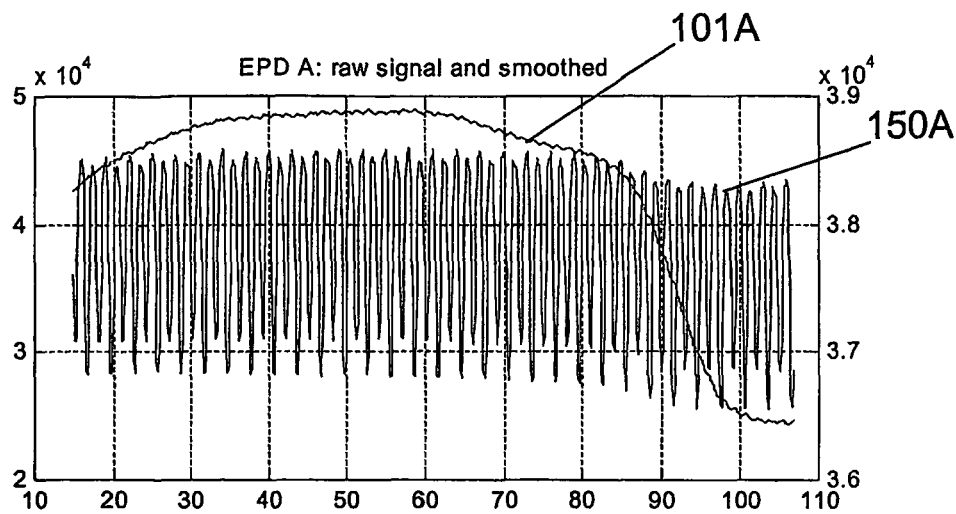
FIGS. 8A-8B illustrate an exemplary raw and filtered endpoint signal according to another embodiment of the present invention.
Figure 8B:
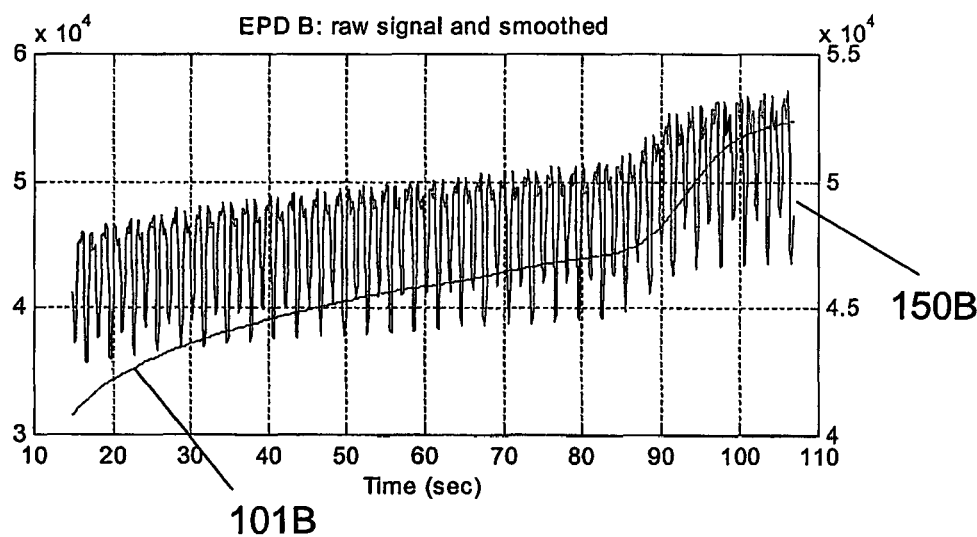

As described above, the endpoint signal, as depicted in FIG. 6, can comprise a raw (unfiltered) endpoint signal. Alternately, in some cases where the signal-to-noise ratio can be low, filtering the endpoint signal can be necessary to smooth the raw signal. In such cases, signal filtering can comprise at least one of applying moving (running) averages, and finite impulse response functions to the raw signal. For example, FIGS. 8A and 8B present typical raw endpoint signals 101A, 101B, and corresponding smoothed endpoint signals 150A, 150B using a moving average. Alternately, when derivatives are taken of an endpoint signal or ratio signal, additional filtering can be imposed either explicitly or implicitly. For example, signal differencing can be performed using one of simple differencing schemes as described above, simple differencing and smoothing (i.e. moving average of the difference signal), and a Savitsky-Golay filter. In the latter, further details are provided in co-pending U.S. Application Ser. No. 60/422,510, entitled "Method and apparatus for detecting endpoint", filed on even date herewith, which is incorporated herein by reference in its entirety.

FIG. 9 presents an in-situ method of determining an etch property for etching a layer on a substrate in a plasma processing system according to an embodiment of the present invention. The method is illustrated in a flowchart 200 beginning in step 210 with providing a thickness of the layer etched on the substrate in the plasma processing system described, for example, in FIGS. 1 through 5. The thickness can, for example, comprise at least one of a minimum thickness, a maximum thickness, a mean thickness, and a thickness range. Prior to etching the layer, one or more layer thicknesses are generally known. In step 220, the layer is etched utilizing processes known to those skilled in the art of dry etching with plasma and beginning at an etch start time.

In step 230, at least one endpoint signal is measured using a diagnostic system coupled to a process chamber, wherein the process chamber is utilized to facilitate the process prescribed for the plasma processing system. The diagnostic system can comprise at least one of an optical diagnostic subsystem and an electrical diagnostic subsystem. For example, the optical diagnostic subsystem can comprise at least one of a detector, an optical filter, a grating, a prism, a monochromator, and a spectrometer. Additionally, for example, the electrical diagnostic subsystem can comprise at least one of a voltage probe, a current probe, a spectrum analyzer, an external RF antenna, a power meter, and a capacitor setting monitor. The at least one endpoint signal can comprise an endpoint transition as described above. Furthermore, the endpoint transition can comprise a starting time, an end time, and an inflection time. Additionally, for example, the at least one endpoint signal can comprise a spectral irradiance of light emitted from the plasma.

In step 240, an etch rate for the etching of the layer on the substrate in the plasma processing system is determined using the at least one endpoint signal and the thickness of the layer. For example, the etch rate can be determined from a ratio of the minimum thickness of the layer to the difference in time between the starting time of the endpoint transition and the starting time of the layer etching (see equation (2)). Alternately, the etch rate can be determined from a ratio of the maximum thickness of the layer to the difference in time between the end time of the endpoint transition and the starting time of the layer etching (see equation (3)). Alternately, the etch rate can be determined from a ratio of the mean thickness of the layer to the difference in time between the inflection time of the endpoint transition and the starting time of the layer etching (see equation (4)). Alternately, the at least one endpoint signal can comprise two endpoint signals, namely, a first endpoint signal and a second endpoint signal. A ratio signal can be determined from the first and second endpoint signal by performing a ratio of the two signals at each instant in time. The ratio signal can further comprise an endpoint transition, wherein the endpoint transition comprises a starting time, an end time, and an inflection time. Furthermore, the etch rate can be determined from the ratio signal using any one of the above described methods in equations (2) through (4), or (7).

The in-situ method described in flowchart 200 can further comprise step 250 wherein a time duration of the endpoint transition is determined. For example, the time duration of the endpoint transition can be determined from the first derivative of an endpoint signal as indicated by 120 in FIG. 6, or from the first derivative of the ratio signal of two endpoint signals as indicated by 144 in FIG. 7D.

In step 260, an etch rate uniformity is determined from the etch rate determined in step 240, the time duration of the endpoint transition determined in step 250, and the thickness range of the layer etched. For example, the etch rate uniformity can be determined utilizing equation (6).

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An in-situ method of determining an etch property for etching a layer on a substrate in a plasma processing system comprising:
    providing a thickness of said layer, wherein said thickness comprises at least one of a minimum thickness, a maximum thickness, a mean thickness, and a thickness range;
    etching said layer on said substrate;
    measuring at least a first endpoint signal corresponding to emission from a chemical constituent whose concentration decays during endpoint and a second endpoint signal corresponding to emission from a chemical constituent whose concentration rises during endpoint using a diagnostic system coupled to said plasma processing system, wherein at least one endpoint signal comprises an endpoint transition; and
    determining said etch rate from a ratio of said thickness to a difference between a time during said endpoint transition and a starting time of said etching.

2. The method as recited in claim 1, wherein at least one endpoint signal is related to a spectral irradiance of emitted light from said plasma processing system.

3. The method as recited in claim 1, wherein at least one endpoint signal is filtered.

4. The method as recited in claim 1, wherein said method further comprises determining a time duration for said endpoint transition of at least one endpoint signal.

5. The method as recited in claim 4, wherein said method further comprises determining an etch rate uniformity from said etch rate, said time duration of said endpoint transition, and said thickness range of said layer.

6. The method as recited in claim 1, wherein said diagnostic system comprises at least one of an optical diagnostic subsystem and an electrical diagnostic subsystem.

7. The method as recited in claim 6, wherein said optical diagnostic subsystem comprises at least one of a detector, an optical filter, a grating, and a prism.

8. The method as recited in claim 6, wherein said optical diagnostic subsystem comprises at least one of a spectrometer and a monochromator.

9. The method as recited in claim 6, wherein said electrical diagnostic subsystem comprises at least one of an external RF antenna measuring a radiated RF field external to the plasma processing system, and a capacitor setting monitor monitoring capacitor settings in an impedance match network.

10. The method as recited in claim 1, wherein said endpoint transition comprises a starting time, an end time, and an inflection time.

11. The method as recited in claim 10, wherein said thickness is said minimum thickness of said layer and said time is said starting time of said endpoint transition.

12. The method as recited in claim 10, wherein said etch rate is determined from a ratio of said maximum thickness of said layer to said end time of said endpoint transition in one of said endpoint signals.

13. The method as recited in claim 10, wherein said etch rate is determined from a ratio of said mean thickness of said layer to said inflection time of said endpoint transition in one of said endpoint signals.

14. The method as recited in claim 1, wherein a ratio signal is determined from a ratio of the first endpoint signal to the second endpoint signal.

15. The method as recited in claim 14, wherein said ratio signal comprises an endpoint transition.

16. The method as recited in claim 15, wherein said method further comprises determining a time duration for said endpoint transition of said ratio signal.

17. The method as recited in claim 16, wherein said method further comprises determining an etch rate uniformity from said etch rate, said time duration of said endpoint transition, and said thickness range of said layer.

18. The method as recited in claim 15, wherein said endpoint transition comprises a starting time, an end time, and an inflection time.

19. The method as recited in claim 18, wherein said etch rate is determined from a ratio of said minimum thickness of said layer to said starting time of said endpoint transition in said ratio signal.

20. The method as recited in claim 18, wherein said etch rate is determined from a ratio of said maximum thickness of said layer to said end time of said endpoint transition in said ratio signal.

21. The method as recited in claim 18, wherein said etch rate is determined from a ratio of said mean thickness of said layer to said inflection time of said endpoint transition in said ratio signal.

* * * * *